United States Patent [19]
Rubner et al.

[11] Patent Number: 5,536,573
[45] Date of Patent: Jul. 16, 1996

[54] MOLECULAR SELF-ASSEMBLY OF ELECTRICALLY CONDUCTIVE POLYMERS

[75] Inventors: Michael F. Rubner, Westford, Mass.; Josephine Ho-Wah Cheung, Columbia, Md.

[73] Assignee: Massachusetts Institute of Technology, Cambridge, Mass.

[21] Appl. No.: 271,085

[22] Filed: Jul. 6, 1994

Related U.S. Application Data

[63] Continuation-in-part of Ser. No. 86,548, Jul. 1, 1993.

[51] Int. Cl.⁶ .............................. D02G 3/36; B05D 5/12; B32B 33/00; H01B 1/12
[52] U.S. Cl. .................. 428/378; 427/336; 427/339; 427/500; 427/58; 427/407.1; 427/474.4; 252/500; 437/225
[58] Field of Search ................... 427/352, 443.2, 427/407.1, 58; 428/216, 500, 333, 338, 339, 474.4, 336, 378; 437/225; 252/500

[56] References Cited

U.S. PATENT DOCUMENTS

| | | | |
|---|---|---|---|
| 3,831,432 | 8/1974 | Cox | 73/23 |
| 4,552,927 | 11/1985 | Warren | 525/279 |
| 4,820,595 | 4/1989 | MacDiarmid et al. | 429/27 |
| 4,847,115 | 7/1989 | Warren et al. | 427/412 |
| 4,940,517 | 7/1990 | Wei | 204/78 |
| 4,963,206 | 10/1990 | Shacklette et al. | 427/163 |
| 4,983,322 | 1/1991 | Elsenbaumer | 250/500 |
| 4,983,460 | 1/1991 | Balanzat et al. | 427/412.1 |
| 5,006,278 | 4/1991 | Elsenbaumer | 427/385.5 |
| 5,017,975 | 5/1991 | Ogawa | 351/8 |
| 5,045,357 | 9/1991 | Motonaga et al. | 427/255 |
| 5,061,294 | 10/1991 | Harmer et al. | 427/407.1 |
| 5,108,841 | 4/1992 | Wegmann et al. | 252/500 |
| 5,176,851 | 1/1993 | Barry, Jr. | 427/407.1 |
| 5,186,813 | 2/1993 | Helms | 205/171 |
| 5,208,111 | 4/1993 | Decher et al. | 428/420 |
| 5,210,217 | 5/1993 | Albarella et al. | 548/527 |
| 5,225,495 | 7/1993 | Han et al. | 427/121 |
| 5,248,554 | 9/1993 | Hsu | 427/434.2 |
| 5,262,195 | 11/1993 | Moss et al. | 427/240 |
| 5,270,080 | 12/1993 | Mino et al. | 427/399 |
| 5,273,931 | 12/1993 | Taskar et al. | 437/108 |
| 5,286,414 | 2/1994 | Kämpf et al. | 252/500 |
| 5,310,781 | 5/1994 | Wudl et al. | 252/500 |
| 5,401,537 | 3/1995 | Kochem et al. | 427/388.4 |

FOREIGN PATENT DOCUMENTS

| | | |
|---|---|---|
| 3410494A1 | 10/1985 | Germany. |
| 3532135A1 | 3/1987 | Germany. |
| 4026978A1 | 2/1992 | Germany. |
| WO92/11644 | of 1992 | WIPO. |

OTHER PUBLICATIONS

Chiang, Jin—Chih and Alan G. MacDiarmid, "Polyanilane: Protonic Acid Doping of the Emeraldine Form to the Metallic Regime," *Synthe. Met.* 13:193–205 Jan. (1986).

(List continued on next page.)

*Primary Examiner*—Diana Dudash
*Attorney, Agent, or Firm*—Arnall Golden & Gregory

[57] ABSTRACT

A thin-film heterostructure bilayer is formed on a substrate by a molecular self-assembly process based on the alternating deposition of a p-type doped electrically conductive polycationic polymer and a conjugated or nonconjugated polyanion or water soluble, non-ionic polymer has been developed. In this process, monolayers of electrically conductive polymers are spontaneously adsorbed onto a substrate from dilute solutions and subsequently built-up into multilayer thin films by alternating deposition with a soluble polyanion or water soluble, non-ionic polymer. In contrast to a deposition process involving the alternate self-assembly of polycations and polyanions, this process is driven by non-covalent bonded attractions (for example, ionic and hydrogen bonds) developed between a p-type doped conducting polymer and a polymer capable of forming strong secondary bonds. The net positive charge of the conducting polymer can be systematically adjusted by simply varying its doping level. Thus, with suitable choice of doping agent, doping level and solvent, it is possible to manipulate a wide variety of conducting polymers into uniform multilayer thin films with layer thicknesses ranging from a single monolayer to multiple layers.

10 Claims, 5 Drawing Sheets

OTHER PUBLICATIONS

Decher, G., et al., "Buildup of ultrathin multilayer films by a self—assembly process: III. Consecutively alternating adsorption of anionic and cationic polyelectrolytes on charged surfaces," *Thin Solid Films* 210/211:831–835 Apr. (1992).

"Coulombic interactions in Macromolecular Systems" ACS Symposium Series No. 302, A, Eds., Eisenberg and F. Bailey (1986) no month available.

Liao, Y. H. and K. Levon, "Polymeric Dopants for Polyaniline, " PSME Preprints, ACS Meeting, Chicago, (Aug. 1993).

Malhotra, B. D., et al., "Polyaniline/Polymeric Acid Composite, a Novel Conducting Rubber," *J. Appl. Polym. Sci.* 40:1049 Jul. (1990).

Royappa and M. F. Rubner, "Novel Langmuir–Blodgett Films of Conducting Polymers. 1. Polion Complexes and Their Multilayer Heterostructures," *Langmuir 8:3168–3177 (1992) Dec.*

Stockton, William B. and Michael F. Rubner, "Electrically Conducting Blends and Novel Self–Assembled Films of Polyaniline with Poly(vinyl Pyrrolidone)," 319 (Mar. 1994).

Swalen, J. D., et al., "Molecular Monolayers and Films," *Langmuir* 3:932–950 (1987) Nov.

Trivedi, D. C. and S. K. Dhawan, "Investigations on the effect of 5–sulfosalicylic acid on the properties of polyaniline", *Synthe. Met.* 58:309–324 (1993) May.

Yang, C. Y., et al., "Morphology of Polyaniline in Solution Processed Blends with Poly(methyl) methacrylate)," *Polymer Reprints, ACS Meeting, Denver (March 1993.*

Yang. S. Y. and E. Ruckenstein, "Processable conductive composites of polyaniline/poly(alkyl methacrylate) prepared via an emulsion method," *Synthe. Met.* 59:1–12 (1993) Jun.

Yue. J., and A. J. Epstein, "Synthesis of Self–Doped Conducting Polyanilane," *J. Am. Chem. Soc. 112:2800 (1990) no month available.*

Andreatta, Alejandro and Paul Smith, "Processing of Conductive Polyaniline–UHMW Polyethylene Blends from Solutions in Non–Polar Solvents,"*Synthe. Met.* 55–57:1017–1022 Mar. (1993).

Cao, Yong, et al. "Counter–ion induced processibility of conducting polyaniline and of conducting polyblends of polyaniline in bulk polymers," *Synth. Met.*, 48:91–97 (1992) Jun.

FIG. 4
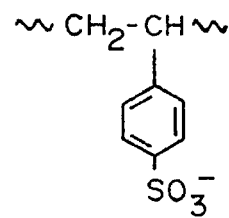
sulfonated polystyrene
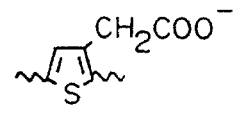
poly(3-thiophene acetic acid)
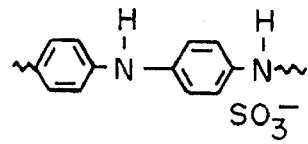
sulfonated polyaniline
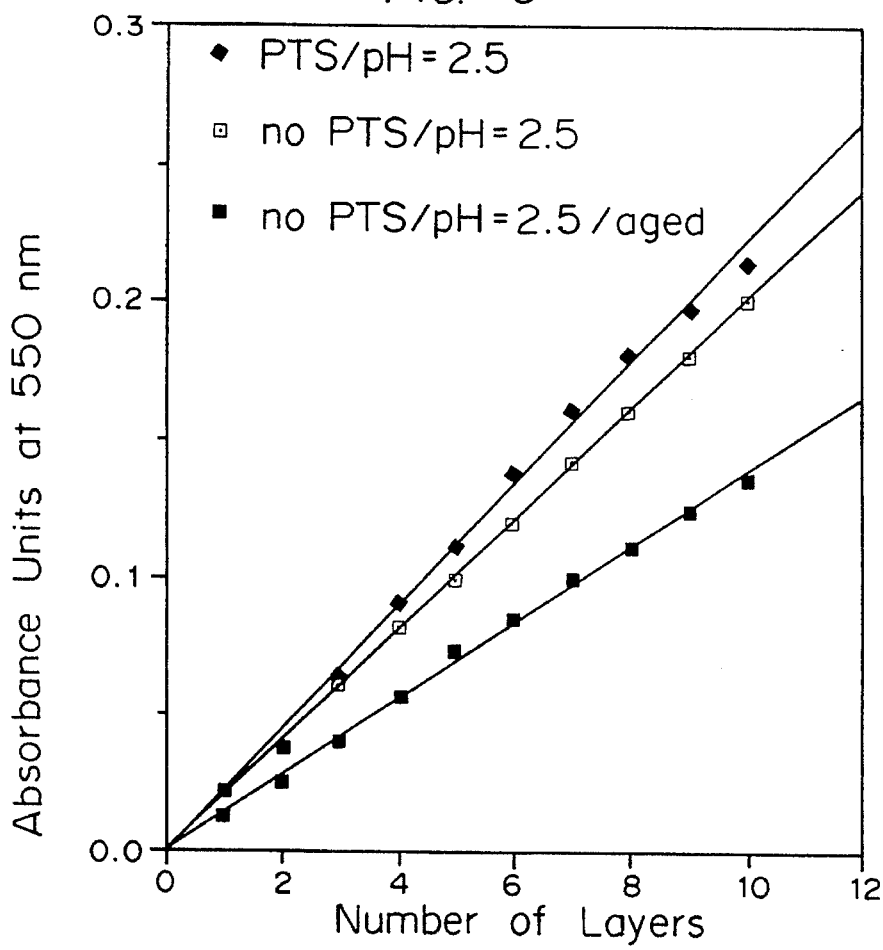
FIG. 3

MOLECULAR SELF-ASSEMBLY OF ELECTRICALLY CONDUCTIVE POLYMERS

The United States government has rights in the invention by virtue of Grant Nos. 9023867-CTS and 9022933-DMR from the National Science Foundation.

The present application is a continuation-in-part of U.S. Ser. No. 08/086,548, pending, entitled "Molecular Self-Assembly of Electrically Conductive Polymers" filed Jul. 1, 1993, by Michael F. Rubner and Josephine Ho-Wah Cheung.

BACKGROUND OF THE INVENTION

The present invention is generally in the area of the fabrication of multilayer thin films of electrically conducting polymers.

Ultrathin organic films are currently gaining interest in many areas such as integrated optics, sensors, friction reducing coatings or surface orientation layers, as described, for example, by Swalen, et al., *Langmuir* 3, 932 (1987) and the Special Issue on Organic Thin Films, *Adv. Mater.* 3 (1991). Most of these functions require the preparation of well defined films composed of molecules with appropriate properties in a unique geometrical arrangement with respect to each other and to the substrate. Molecularly thin layers, particularly those deposited one layer at a time, offer the possibility to construct multilayer assemblies in which the distance between two molecules can be controlled in the Angstrom range. As a result, the processing and manipulation of polymer monolayers has recently emerged as a viable means to create ultra thin polymer coatings with well defined molecular organizations.

The surfaces of various materials can be dramatically modified by the deposition of monolayers of polymers onto the substrate. Such surface modification, for example, can be used to promote adhesion and lubrication, prevent corrosion, modify the electrical and optical properties of the material or create electroactive monolayers suitable for various optical and electronic sensors and devices. In many cases, however, the deposition of a single monolayer is not sufficient to achieve the desired changes in surface characteristics and it is necessary to coat the substrate with multiple layers of the polymer. This presents a significant problem as typical adsorption processes (both chemical and physical) are self-limiting, thereby only allowing the deposition of a single monolayer with thicknesses in the range of 5–30 Å. Thus, one would like to have the ability to deposit multilayer thin films onto substrates.

There are four principal methods for the preparation of ultrathin multilayered films: solution casting, Langmuir-Blodgett technique, chemisorption, and the method of Decher, et al. Solution casting of preformed bilayer aggregates and annealing of spin coated films of copolymers yields layered structures, but the alignment of the layers and the positioning of molecules with respect to each other is limited. In the Langmuir-Blodgett (LB) technique, a film is prepared on the surface of water and then transferred onto solid substrates. This method, however, is inconvenient for automation and large scale application and is generally only applicable to flat substrates. Another method is based on chemisorption but requires exacting conditions and oftentimes multiple chemical reactions.

Recently, Decher, et al., *Thin Solid Films* 210/211, 831 (1992) and DE 4026978 (WO92-073188/10), have demonstrated that it is possible to build up multilayer thin films of polymers onto charged surfaces via the alternating deposition of polycations and polyanions. The basis for this multilayer assembly process is the ionic attraction of the permanently fixed charges that exist on the polycations (positive charge) and polyanions (negative charge). In essence, the excess charge of a polyion adsorbed onto a substrate surface is used to attract a polyion of the opposite charge onto the surface. Multilayer thin films are fabricated by simply alternating the dipping process.

The self-assembly process as described by Decher and coworkers is illustrated in FIG. 1. In this case, a positively charged glass substrate 10, created by suitable silane chemistry, is first immersed into a dilute solution of a polyanion 12 followed by immersion in a dilute solution of a polycation 14. As indicated in the figure, repetition of this cycle produces a multilayer thin film comprised of alternating layers of polycations 14 and polyanions 12. The thickness and conformation of each polymer layer deposited are determined by the chemistry of the depositing solution. For example, solutions with relatively high polyion concentrations or high ionic strengths favor the formation of thicker monolayers deposited in the form of random coils whereas very dilute solutions produce thinner monolayers with polymer chains adopting a more extended chain conformation.

This approach can be used to manipulate a variety of different polyions, including conjugated polyions (conjugated polymers fitted with ionizable sidegroups). These latter materials, frequently referred to as conducting polymers, are of interest due to their unusual electrical and optical properties which have their origin in the delocalized electronic states of the polymer's conjugated backbone. Although layer-by-layer deposition is possible with conjugated polyions, such materials simply do not exhibit the range of properties found in conjugated polymers that do not contain ionizable sidegroups. In short, the addition of ionizable sidegroups to the repeat structure of a conjugated polymer significantly compromises the level of conductivity achievable with the polymer and lowers its environmental stability. It is therefore much more desirable and useful to be able to fabricate more conventional conjugated polymers such as polyaniline and polypyrrole into ultrathin multilayer thin films.

Although these nonderivatized conjugated polymers have been identified as the source of many potentially useful electrical and optical properties, it is extremely difficult to process the electrically conductive forms of these materials into technologically useful forms. For example, many applications proposed for conducting polymers, such as microelectronic devices, chemical and biochemical sensors, electrochromic displays, anti-corrosion coatings and transparent antistatic coatings, require thin films of electrically conductive polymers with precisely controlled thicknesses and molecular organizations. Indeed, it is apparent that significant progress could be made towards the application of these materials if they could be obtained in large area, thin film forms in which both the thickness and molecular organization of the film were controllable at the molecular level.

Some attempts have been made to accomplish this important goal. For example, Milliken Corp. has disclosed a procedure for coating various textile fibers with uniform, electrically conductive films of polypyrrole and polyaniline. Specifically, the deposition of an electrically conductive coating of polypyrrole onto the fibers is accomplished by placing the fibers into a dilute aqueous solution of pyrrole that also contains an oxidizing agent such as ferric chloride and negative counterions suitable for enhancing the conductivity and conductivity stability of the polymer. The counterions are typically added in the form of sulfonic acids such as naphthalene disulfonic acid. A typical coating solution contains about 10 g/l ferric chloride anhydride, 5 g/l toluenesulfonic acid and 0.2 g of pyrrole monomer.

Although this chemistry is well suited for coating fibers with thin films of conducting polymers such as polypyrrole and polyaniline, it is not possible to use this process to fabricate multilayer thin films with precisely controlled thicknesses and layer sequences. Since the chemistry used to deposit a conducting polymer coating cannot be controlled at the molecular level it is extremely difficult to reproducibly deposit ultra-thin coatings in the range of 10–50 Å thick. In short, the Milliken process and related processes for creating thin film coatings of conducting polymers simply do not provide layer-by-layer molecular level control over the deposition process nor the structure of the film. The fabrication of multilayer heterostructures of conducting polymers is therefore not possible with currently known techniques.

It is therefore an object of the present invention to provide a method for producing multilayered thin films of conducting polymers having high electrical conductivities which are environmentally stable.

It is another object of the present invention to provide multilayered thin films of conducting polymers with high electrical conductivities which are environmentally stable.

It is still another object of the present invention to provide methods for solubilizing p-doped conjugated polymers, and the solutions, for use in making multilayered thin films.

SUMMARY OF THE INVENTION

A molecular self-assembly process based on the alternating deposition of a p-type doped electrically conductive polymer and a conjugated or nonconjugated polyanion or water soluble, non-ionic polymer has been developed. In this process, monolayers of electrically conductive polymers are spontaneously adsorbed onto a substrate from dilute solutions and subsequently built-up into multilayer thin films by alternating deposition with a soluble polyanion or non-ionic polymer. In contrast to a deposition process involving the alternate self-assembly of polycations and polyanions, this process is driven by non-covalent bonded attractions (for example, ionic and hydrogen bonds) developed between a p-type doped conducting polymer and a polymer capable of forming strong secondary bonds. In the case of the water soluble, non-ionic polymer, secondary bonding appears to be by formation of hydrogen bonds. The net positive charge of the conducting polymer can be systematically adjusted by simply varying its doping level. Thus, with suitable choice of doping agent, doping level and solvent, it is possible to manipulate a wide variety of conducting polymers into exceptionally uniform multilayer thin films with layer thicknesses ranging from a single monolayer to multiple layers.

As described in the examples, this process has been used to assemble thin films of electrically conductive polypyrrole, polyaniline, and poly(3-hexyl thiophene). Conductivities as high as 200 S/cm can be readily obtained on films containing as few as four deposited layers. The process has also been used to assemble multilayer thin films of p-type doped conducting polymers based on polyaniline with poly(vinyl pyrrolidone), poly(vinyl alcohol), poly(ethylene oxide), and poly(acrylamide). Since this is a layer-by-layer deposition process, it is also possible to use this approach to fabricate complex multilayer thin films containing layers of different conducting polymers.

BRIEF DESCRIPTION OF THE DRAWINGS

FIG. 3 is a graph showing an overlay of several optical absorption versus number of deposited layer plots that illustrate the linear nature of the polypyrrole deposition process for three different solutions, PTS pH 2.5 (dark diamonds); no PTS pH 2.5 (open squares); no PTS pH 2.5, aged (dark squares).

FIG. 4 shows examples of polyanions that can be used to fabricate p-type doped polypyrrole multilayers in a layer-by-layer manner.

DETAILED DESCRIPTION OF THE INVENTION

Figure 1:
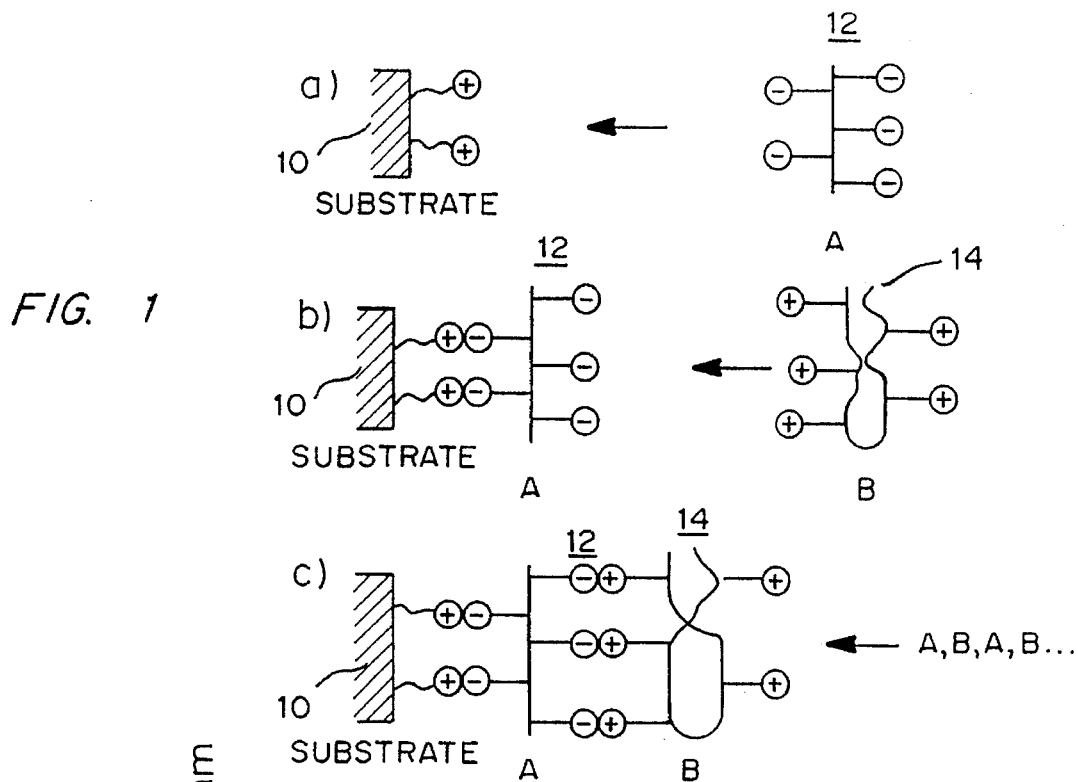
FIG. 1 is a schematic of a molecular self-assembly process involving the alternate deposition of polyanions and polycations, as described by Decher, et al. in the prior art.

A very versatile means for fabricating multilayer thin films with new electrical and optical properties is disclosed which utilizes a molecular-level, layer-by-layer deposition process. This process is especially useful for the construction of heterostructure thin films with complex molecular architectures and thicknesses that are controllable at the molecular level. The basic process used to create alternating layer thin films involves dipping a substrate into a dilute solution of a p-type doped polymer such as a p-doped conjugated polymer, rinsing the substrate with water (or other solvent for the polymer) and then dipping it into a dilute solution containing a polyanion or a water soluble, non-ionic polymer. This process can be repeated as many times as desired to build multilayer thin films in which each bilayer deposited is only about 10–100 Å in thickness, depending on parameters such as solution concentration, doping level, pH, and ionic strength. Results show that a variety of p-type doped conjugated polymers and conjugated and nonconjugated polyions or water soluble, non-ionic polymers can be deposited, thereby making it possible to fabricate a diverse collection of new multilayer heterostructures based on conducting polymers.

In contrast to the Decher process in which multilayer thin films are built up in a layer-by-layer fashion via the ionic attractions developed between negatively and positively charged polyions (sometimes called polyelectrolytes), this process is driven by the attractions developed between a positively charged p-type doped conducting polymer and negatively charged polyion or water soluble, non-ionic polymer. The positive charges of the conducting polymer are not created by the ionization of permanently fixed sidegroups such as organic acid or base containing sidegroups, but are rather in the form of partially delocalized defect states that exist along the polymer backbone as a result of doping. Since the number of these doping induced defect states created along the backbone (polarons, bipolarons, etc.) depend directly on the oxidation state of the conjugated polymer, they can be systematically varied from none (neutral polymer, no multilayer assembly possible) to about one every three or four repeat units (highly oxidized polymer). The ability to readily control the linear density of positive charges along the polymer backbone via chemical doping provides an additional level of control over the polymer deposition process. This type of charge control is simply not possible with permanently fixed ionic charges and is surprising since it was not previously recognized that partially delocalized charge defect states could be utilized to attract negatively charged polymers in a multilayer deposition process.

Once it is recognized that the backbone delocalized charges created by chemical doping can be used to fabricate alternating layers of conducting polymers and negatively charged polyions or water soluble, non-ionic polymers, it becomes necessary to develop the chemistry needed to produce dilute solutions of these materials in their doped forms. It is well recognized that nonderivatized, doped conducting polymers are insoluble in most solvents, particularly water. In fact, the process of doping a conjugated polymer inevitably renders it insoluble in an aqueous solution. This is in sharp contrast to conjugated polyions which become very water soluble when their sidegroups are ionized into their salt forms.

The fact that conducting polymers do not become highly water soluble upon doping demonstrates that the charge transfer complexes formed during doping are not simple ionic complexes but are rather a very different state of matter with a unique set of physical and chemical properties. The polaronic-like charges that are created by the doping process impart properties to the polymer that are quite different from those developed when ionic charges are created by the ionization of simple organic acids and bases. Further, it is generally well accepted that, in contrast to conventional polyions (including conjugated polyions), the doped forms of these materials are not very stable in aqueous solutions.

It has now been found that the generation of water soluble, p-type doped conducting polymers can be accomplished in a number of different ways. In one embodiment, conducting polymer chains are formed in situ in a dilute aqueous solution primarily consisting of a monomer and an oxidizing agent. In this case, the conducting polymer is actually created in the solution and subsequently spontaneously adsorbed onto the substrate surface as a uniform, ultra-thin film of between approximately 10 to greater than 250 Å in thickness, more preferably between 10 and 100 Å.

Thin, electrically conductive coatings of polypyrrole and polyaniline, for example, can be formed on various substrates by simply placing the object to be coated in an aqueous bath containing dilute (less than about 0.1 m/l) quantities of pyrrole (or aniline) monomer and a suitable oxidizing agent such as ferric chloride or ammonium peroxysulfate. The use of dilute solutions of the monomer insures that the electrically conductive polymer formed from the oxidative polymerization of the monomer will be deposited exclusively onto the substrate to be coated as opposed to simply polymerizing in the solution and precipitating out as an insoluble powder.

Highly uniform and dense multilayer thin films can be easily fabricated by simply dipping the substrate into a dilute aqueous solution of a polyanion, whereby a monolayer of this material is deposited onto the p-type doped conducting polymer. This process of alternately depositing layers of a p-type doped polymer and a negatively charged polyanion can be repeated as often as needed to create thin films with precisely controlled thickness and structure.

Alternatively, in a second embodiment, preformed conducting polymers are used directly by forming dilute solutions of their doped forms in suitable solvent systems. In this case, it is necessary to control the type of solvent system used and the level and type of chemical doping of the polymer chains. The general procedure involves first dissolving the undoped polymer in a suitable organic solvent and subsequently diluting this polymer solution with a solvent that contains a dopant for the polymer. This produces a solvent system capable of solvating the doped polymer chains. In the case of polyaniline, for example, it has been found that dilute aqueous solutions can be easily formed by first dissolving the nonconducting emeraldine-base form of this polymer in dimethylacetamide (DMAc) (or n-methyl pyyrolidone) (NMP) and subsequently diluting this solution with acidic water such that the final solution has a 90/10 water to DMAc volume ratio. Since the final step of this process also acid dopes the polymer, the level of doping can be easily adjusted by controlling the pH level of the final dipping solution. Solutions with polyaniline concentrations as high as 0.01 m/l are easily prepared with this procedure. The net result is a stable, water based solution (90% water) of doped polyaniline that is quite well suited for molecular self-assembly via alternate deposition with polyanions.

Using these solutions, it has been found that multilayer thin films of electrically conductive polyaniline can be easily constructed by alternately dipping a substrate into a dilute polyaniline solution and then into a dilute polyanion solution or a water soluble non-ionic polymer solution. Optical microscopy indicates that the resultant multilayer thin films are homogeneous and uniform at the micron scale.

Polyaniline (PAn) presents itself as well suited for a variety of applications due to its relative ease of synthesis, low cost, and stable electrical conductivity. The achievable levels of conductivity, ranging from completely insulating up to about 200 S/cm, are generally quite adequate for a wide variety of applications calling for electronic conduction. Early work has shown PAn to have quite limited processability due to its very high melting temperature, and limited solubility. Only the base form of PAn (non-conducting) was considered soluble, primarily in NMP, DMAc and DMSO, but not in common solvents. Once doped by either protonation or by oxidation, the resulting conducting form generally became intractable.

Several research groups have reported approaches to process doped PAn; both homopolymer films, as well as conducting blends. For example, the use of "functionalized" protonic acids, primarily large sulfonic acids as PAn dopants, renders the doped polymer soluble in several organic solvents [C. Y. Yang, et al., *Polymer Preprints*, ACS Meeting, Denver, March 1993; Y. Cao and A. J. Heeger, *Synth. Met.*, 52 (1992), 193; Y. Cao, P. Smith and A. J. Heeger, *Synth. Met.*, 48 (1992), 91; A. Andreatta and P. Smith, *Synth. Met.*, 55 (1993), 1017]. Blends with several host polymers have been reported, including PMMA, nylon, PVC, PS, PVA, PP, PE, ABS, and polycarbonate [Y. Cao, P. Smith and A. J. Heeger, *Synth. Met.*, 48 (1992), 91; A. Andreatta and P. Smith, *Synth. Met.*, 55 (1993), 1017]. Conducting PAn/poly (alkyl methacrylate) blends have been prepared by emulsion polymerization in the presence of HCl [S. Y. Yang and E. Ruckenstein, *Synth. Met.*, 59 (1993)]. Conducting PAn films have been cast from a ferric chloride solution in nitromethane, starting with either PAn base or already-doped PAn, as described by U.S. Pat. No. 4,983,322 to Elsenbaumer. Doped PAn can also be solubilized by the addition of a Lewis base which acts to complex the dopant, rendering the PAn soluble, as described in International Patent Application, No. WO92/11644 by Han, et al., (1992). PAn doped with 5-sulfosalicylic acid (SSA) is soluble in DMSO, DMF, and NMP, as reported by D. C. Trivedi and S. K. Dhawan, *Synth. Met.*, 58 (1993), 309. Two groups have reported doping PAn with a polymeric dopant, sulfonated polystyrene: Y.-H. Liao and K. Levon, *PSME Preprints*, ACS Meeting, Chicago, August 1993; and B. D. Malhotra, et al., *J. Appl. Polym. Sci.*, 40, (1990), 1049.

Details concerning the specific types of materials that can be used in this molecular self-assembly process are provided below.

Conjugated Polymers

Conjugated polymers represent a relatively new class of materials whose electrical and optical properties can be controllably varied over an extremely wide range, oftentimes in a completely reversible manner. This is typically accomplished either by chemical or electrochemical oxidation of the π-system of the polymer backbone or, in some cases, by direct protonation of the polymer backbone. Through this chemical "doping" process, it is possible to systematically vary the electrical conductivity of these materials from the insulating state to the conducting state. The electrically conductive forms of these materials are best described as p-type doped polymeric charge transfer salts in which the conjugated polymer supports positive charges that are delocalized over relatively short segments of the backbone, for example, over three to four repeating units for a highly oxidized polymer. Charge neutrality is maintained by a negatively charged counterion, which is usually derived from the doping agent.

The unique positively charged defect states created on the polymer backbone by the doping process can exist in many different forms, including as polarons (coupled radical cations), bipolarons (coupled dications) and solitons (noninteracting cations). Such charged defect states are believed to be the primary charge carriers in these materials and are therefore responsible for their electrically conductive nature.

Conducting polymers can be in the form of conjugated polyions or nonderivatized conjugated polymers. Nonderivatized conjugated polymers, i.e., those that do not include ionizable sidegroups, are significantly more environmentally stable than their derivatized polyion counterparts and also have been found to exhibit much higher electrical conductivities. Examples include conducting polymers such as polyaniline, polypyrrole and the poly(3-alkylthiophenes). These polymers exhibit significantly better environmental stabilities and much higher electrical conductivities than similar materials modified to contain ionizable sidegroups such as sulfonated polyaniline and poly(thiophene acetic acid).

Specific examples of nonderivatized, p-type doped conjugated polymers that are particularly useful are shown below. Other examples of nonderivatized conjugated polymers can be found in "*Conjugated Polymeric Materials: Opportunities in Electronics, Optoelectronics, and Molecular Engineering*", J. L. Bredas and B. Silbey, Eds., Kluwer, Dordrecht, 1991.

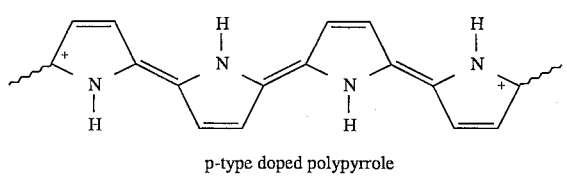

p-type doped polypyrrole

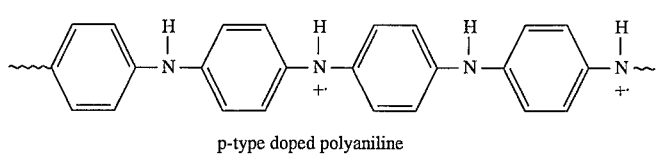

p-type doped polyaniline

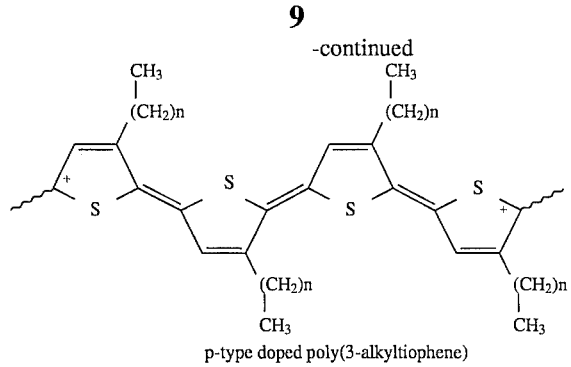

p-type doped poly(3-alkyltiophene)

Conjugated and Nonconjugated Polyanions

Polyanions in the most general sense represent any type of polymer that is fitted with ionizable groups (typically within the repeat unit) that are capable of supporting negative charges when ionized (such as carboxylic acid and sulfonic acid groups). Examples of these negatively charged polyelectrolytes abound in the literature and are well known to those skilled in the art. For example, see, "Coulombic interactions in Macromolecular Systems" ACS Symposium Series No. 302, A. Eisenberg and F. Bailey eds., 1986. Typical examples of conjugated and nonconjugated polyanions include sulfonated polystyrene, sulfonated polyaniline, poly(thiophene acetic acid), polyacrylic acid, and polymethacrylic acid. Examples of some of these conjugated and nonconjugated polyanions are shown below.

Nonconjugated Polyanions

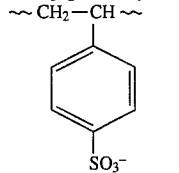

sulfonated polystyrene

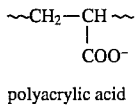

polyacrylic acid

Conjugated Polyanions

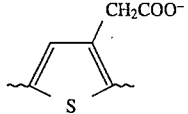

poly(3-thiophene acetic acid)

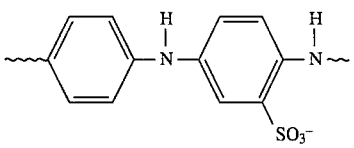

sulfonated polyaniline

Water Soluble, Non-ionic Polymers

Water soluble, non-ionic polymers can be used instead of the polyanions described above. In contrast to the polyanions which are believed to interact with the p-doped polymers by electrostatic interactions, the non-ionic polymers may interact by hydrogen bonding. Examples of suitable water soluble, non-ionic polymers include poly(vinyl pyrrolidone), poly(vinyl alcohol), and poly(ethylene oxide).

Water soluble polymers as described herein typically have a solubility of between $10^{-1}$ to $10^{-4}$ moles of repeat unit of the polymer/liter of water, although it is possible to use polymers having different solubility, both higher and lower, since the selection criteria is based on the preferred deposition conditions. Although reference is made to water solubility, this term is understood to refer to solutions having solubility characteristics of water and therefore can include aqueous solutions or non-aqueous solvents. As used herein, "non-ionic polymers" are those polymers formed from repeat units which do not contain ionizable groups.

The present invention will be further understood by reference to the following non-limiting examples.

EXAMPLE 1

Prior Art Fabrication of Multilayered Thin Film Devices

The Decher process, illustrated in FIG. 1, can be extended to conjugated polymers through the use of conjugated polyions (a conjugated polymer fitted with ionizable sidegroups) such as poly(thiophene acetic acid) and sulfonated polyaniline. These materials, however, do not display high levels of electrical conductivity in their doped forms and are not environmentally stable due to the presence of the ionizable sidegroups that are needed to fabricate the thin films. Thus, thin films with high electrical conductivities (greater than 0.1 S/cm) and useful environmental stabilities cannot be fabricated with the Decher process. This was demonstrated by the following example.

Poly(thiophene-3-acetic acid) (PTAA) was prepared by the ferric chloride polymerization of ethyl thiophene-3-acetate (Lancaster Synthesis) followed by acid hydrolysis of the ester group using the method of A. T. Royappa; A. T. Royappa and M. F. Rubner, Langmuir, 8, (1992) 3168. Sulfonated polyaniline (SPAN) was synthesized using the procedure described by Epstein et al. [J. Yue and A. J. Epstein, J. Am. Chem. Soc., 112 (1990) 2800]. Polyallylamine (PAH) (MW=28,000 g/mole) from Aldrich Chemical Co. was used without further purification.

Solutions containing the polyanions were made by dissolving the appropriate polymer in 0.1M sodium hydroxide and subsequently converting the salt solution to an acidic solution (pH 4.5) by adding HCl. The polycation solutions were made by dissolving the polymer in a pH 4.5 HCl solution. All solutions were rendered acidic to ensure that the amine groups present on the polycations remained in their protonated form.

Glass slides with hydrophobic, hydrophilic and positively charged surfaces were used as substrates for the adsorption process. These substrates were all cleaned by first placing them in a hot $H_2SO_4/H_2O_2$ (7:3) bath for 1 hour and then in a $H_2O/H_2O_2/NH_3$ (5:1:1) bath for 30 minutes. The substrates were extensively rinsed with Mili-Q™ water after each cleaning step. The above procedure produces hydrophilic glass slides. Hydrophobic surfaces were created by gas phase treatment of these slides with 1,1,1,3,3,3 hexamethyl disilazane whereas positively charged surface were made by treating the hydrophilic slides with (N-2-aminoethyl-3-aminopropyltrimethoxysilane) solutions.

For the hydrophilic and hydrophobic slides, multilayers were fabricated by first immersing the substrate in the polycation solution and then in the polyanion solution. The substrates were dipped in each solution for 2 minutes and subsequently washed with a pH 4.5 HCl solution for 15 seconds and rinsed in a pH 4.5 HCl bath for 2 minutes. After each deposition and cleaning step, the samples were air dried. For the positively charged glass slides, the substrates were first immersed in the polyanion solution and then in the polycation solution.

In-plane conductivities were measured on multilayer films deposited onto hydrophilic, positively charged and hydrophobic glass slides using the standard Van der Pauw 4-point method. For the PTAA/polyallylamine based multilayer films, conductivies less than $10^{-6}$ S/cm were measured for the as-prepared films. Similar results were obtained when thin films were fabricated from alternating layers of sulfonated polyaniline and polyallylamine. This particular multilayer system also exhibits an as-prepared conductivity of less than $10^{-6}$ S/cm. In addition, further doping by immersion in a 1.0M HCL solution only resulted in a conductivity of about $10^{-3}$ S/cm. In this latter case, the conductivity decreased very quickly in air and was below $10^{-6}$ S/cm within one day. Thus, as is well documented in the literature, conjugated polyions do not display conductivity levels or stabilities comparable to their nonderivatized counterparts even after doping.

EXAMPLE 2

Fabrication of Multilayer Films by Alternately Dipping a Substrate into an in situ Polymerized Polypyrrole Solution and a Polyanion Solution Solutions suitable for depositing controlled molecular layers of electrically conductive polypyrrole were prepared by adding pyrrole monomer to an aqueous ferric chloride solution ($FeCl_3$) which had been pH adjusted to a desired level using concentrated HCl. In some cases, p-toluene sulfonic acid was also added to the ferric chloride solution. The dipping solution was aged for 15 minutes and filtered with a 1–2 μm filter prior to use. A pyrrole concentration of 0.02 m/l was used in all of the following examples. To avoid the need to filter any unwanted polypyrrole precipitation in the bath, dipping solutions were typically used for only 2 to 3 hours.

Multilayer films were fabricated by alternately dipping a substrate into the in situ polymerized polypyrrole solution and a polyanion solution. The substrates were dipped in the polypyrrole solution for 5 minutes and the polyanion solution for 10 minutes. Between dips, the substrates were vigorously washed with water and dried under a stream of compressed air. An aqueous sulfonated polystyrene (molecular weight 70,000 g/mole) solution of 0.001 m/l and pH=1.0 was used as the polyanion dipping solution.

Table 1 displays the conductivity and thickness per bilayer delivered when different pyrrole/$FeCl_3$ dipping solutions are used to deposit conducting layers of polypyrrole in alternation with sulfonated polystyrene. This table shows that variations in the chemistry of the pyrrole dipping solution can be used to adjust the level of conductivity of the resultant multilayer thin film and the thickness of the bilayers (polypyrrole/sulfonated polystyrene) used to construct the film.

A number of trends are revealed by these data. First, it can be seen that for a given $FeCl_3$ concentration, lowering the pH from 2.5 to 1.0 or to pH 0.0 increases the conductivity of the film. Second, it can be seen that increasing the $FeCl_3$ concentration from 0.003M to 0.006M also increases the conductivity of the resultant multilayers. Finally, these results show that, for a given $FeCl_3$ concentration, the addition of sulfonic acids such as PTS (p-toluene sulfonic acid) can be used to enhance the conductivity of the film.

The thickness per bilayer (polypyrrole plus sulfonated polystyrene) can be adjusted from about 26 Å to about 44 Å by simply changing the concentrations of the reactants added to the polypyrrole dipping solution. Increasing the dipping time in the polypyrrole bath also increases the thickness of each polypyrrole layer deposited in the film.

Although it has been found that the above indicated concentrations and pH levels are particularly well suited for the molecular level, layer-by-layer deposition of polypyrrole with various polyanions, it will be obvious to one skilled in the art that further variations in these levels can be used to adjust and control the conductivity and thickness per bilayer generated with this chemistry.

TABLE 1

Conductivity and thickness per bilayer delivered when different pyrrole/$FeCl_3$ dipping solutions are used to deposit conducting layers of polypyrrole in alternation with sulfonated polystyrene.

| | no PTS 0.003 M $FeCl_3$ | no PTS 0.006 M $FeCl_3$ | 0.026 M PTS 0.006 M $FeCl_3$ |
|---|---|---|---|
| pH = 2.5 | 0.003 S/cm 26 Å | 0.49 S/cm 36 Å | 11.8 S/cm 44 Å |
| pH = 1.0 | 2.0 S/cm 35 Å | 7.6 S/cm 36 Å | 24.0 S/cm 44 Å |
| pH = 0 | 1.0 S/cm 35 Å | 11.5 S/cm 33 Å | 25.2 S/cm 33 Å |

1. All polypyrrole dipping solutions contained 0.02 m/l pyrrole monomer.
2. The reported thicknesses represent the average thickness of a bilayer of polypyrrole/sulfonated polystyrene in a 10 bilayer film.
3. The reported conductivities were measured from films with a total of 10 bilayers.
4. PTS is p-toluene sulfonic acid.

EXAMPLE 3

Fabrication of Device with Layers of Doped Polypyrrole and Sulfonated Polystyrene Alternately Deposited onto a Positively Charged Substrate Layers of doped polypyrrole and sulfonated polystyrene were alternately deposited onto a positively charged glass slide and the visible absorption spectrum of the resultant film was recorded after each complete bilayer was deposited (polypyrrole plus sulfonated polystyrene). The polypyrrole dipping solution consisted of 0.02 m/l pyrrole, 0.006 m/l $FeCl_3$ and was operated at a pH=1.0. The deposition process involved first dipping the glass substrate into the sulfonated polystyrene bath for 10 minutes (sulfonated polystyrene bath: 0.001 m/l, pH=1.0), rinsing with water, and then dipping the substrate into the polypyrrole bath for 5 minutes.

This process was repeated to build up a multilayer thin film. The surface of the glass slide was rendered positively charged by treatment with N-2-aminoethyl- 3-aminopropyl-trimethoxysilane.

Figure 2:
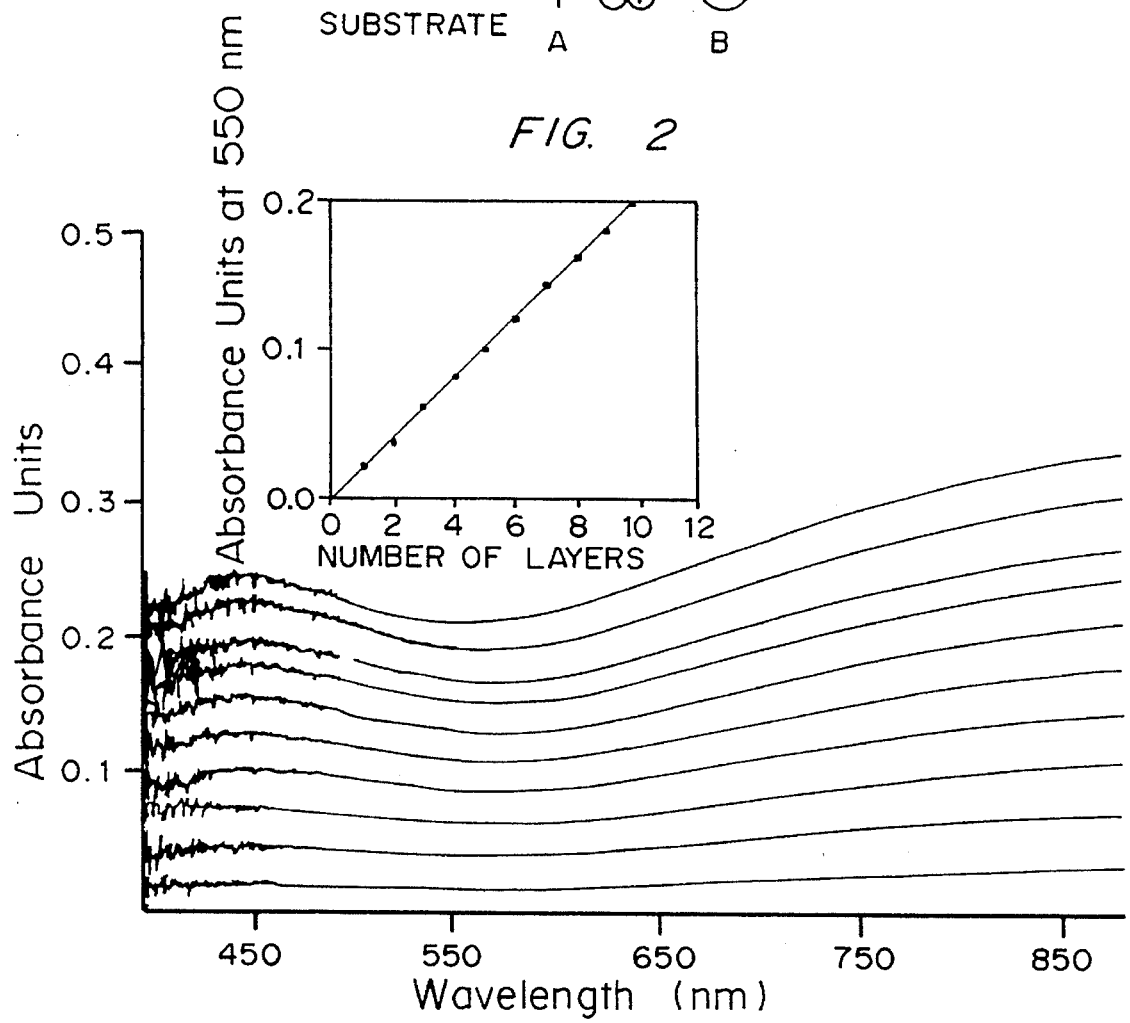
FIG. 2 displays the optical absorption data generated during the self-assembly of alternating layers of doped polypyrrole and sulfonated polystyrene. This figure shows that the broad visible absorption band characteristic of highly conductive polypyrrole increases incrementally with each additional layer deposited in the multilayer film. The inset of this figure shows that this is a linear process indicating that each deposited layer of polypyrrole contributes an equal and reproducible amount of material to the film.

FIG. 2 displays the optical absorption data generated during the self-assembly of these alternating layers of doped polypyrrole and sulfonated polystyrene. This figure shows that the broad visible absorption band characteristic of highly conductive polypyrrole increases incrementally with each additional layer deposited in the multilayer film. The inset of this figure shows that this is a linear process indicating that each deposited layer of polypyrrole contributes an equal and reproducible amount of material to the film. This demonstrates that this is a true layer-by-layer deposition process. The resultant multilayer thin film was found to display good environmental stability and exhibit a conductivity of 10 S/cm.

EXAMPLE 4

Comparison of the Linear Nature of the Polypyrrole Deposition Process for Three Different Solutions FIG. 3 shows an overlay of several optical absorption versus number of deposited layer plots that illustrate the linear nature of the polypyrrole deposition process for three different solutions. In all cases, the polypyrrole dipping solution consisted of 0.02 m/l pyrrole, 0.006 m/l $FeCl_3$ and was operated at a pH=2.5. The polyanion solution was a 0.001 m/l, pH=1.0 sulfonated polystyrene solution. In one case, p-toluene sulfonic acid was added to this stock solution whereas in the other the solution was simply aged for 4 hours prior to use. These plots show that all of these solutions deliver a reproducible amount of polypyrrole with each dip, with the PTS solution depositing the greater amount of polypyrrole and the aged solution the least. Thus, an "aged" solution delivers less polymer per layer than a "fresh" solution with the same chemistry. Note, however, that the deposition process remains remarkably linear even after the solution has been aged for 4 hours.

EXAMPLE 5

Fabrication of Multilayer Thin Films with Polypyrrole and a Variety of Different Polyanions Using the same conditions and process described in Example 2, multilayer thin films were fabricated with polypyrrole and a variety of different polyanions. Optical absorption experiments similar to those described in Example 2 again demonstrated that the multilayer thin films were formed in a linear, layer-by-layer fashion with each layer contributing an equal and reproducible amount of material to the film.

Specifically, the absorption band associated with the conducting form of polypyrrole was in all cases found to grow in a very linear fashion with the number of layers deposited in the film. Examples of the conjugated and nonconjugated polyanions that were tested are shown in FIG. 4.

EXAMPLE 6

Fabrication of Highly Transparent, Electrically Conductive Coatings on Plastic Substrates This example shows that this process can be used to create highly transparent, electrically conductive coatings on various plastics including molded parts with complex shapes. Such coatings are ideally suited for applications requiring transparent anti-static coatings.

Using the deposition process described in Example 2 and a polypyrrole dipping solution containing 0.02 m/l pyrrole, 0.006 m/l $FeCl_3$ and 0.026 m/l p-toluene sulfonic acid (the pH of solution was pH=1.0), two bilayers of polypyrrole/ sulfonated polystyrene were deposited onto polystyrene culture dishes and poly(ethylene terephthalate) plastic sheets. The substrates to be coated were first dipped into the sulfonated polystyrene bath followed by dipping into the polypyrrole bath. In both cases, the plastic dishes and sheets were coated with a uniform, ultrathin, essentially transparent coating consisting two alternating layers of polypyrrole/ sulfonated polystyrene. The surface resistance of these various coated plastic substrates was in the range of 10 to 15 k ohms. This value was essentially the same one month after the initial measurements were made. Thus, with as few as two bilayers it is possible to create uniform, transparent coatings with very low resistivities. The adhesion of these coatings to the plastic substrates was found to be excellent as determined by the standard tape peel test.

EXAMPLE 7

Figure 5:
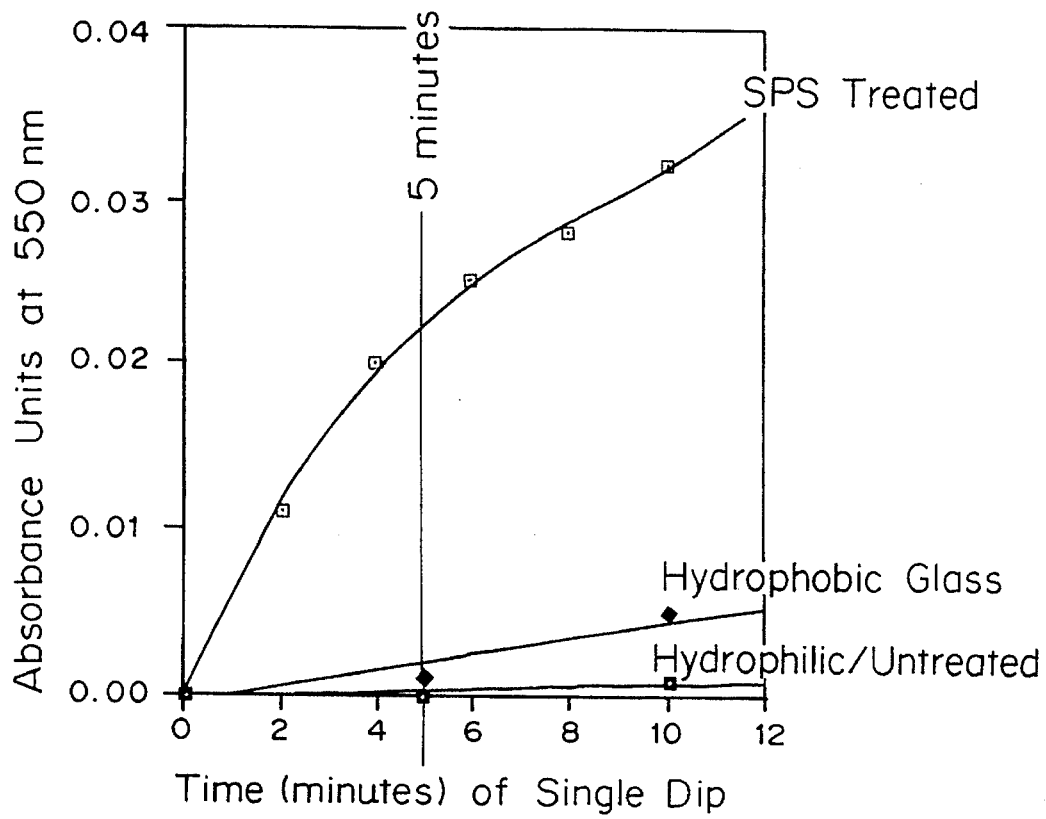
FIG. 5 is a graph showing how the amount of polypyrrole (measured as absorbance units at 550 nm) deposited onto a surface during a single dip in a polypyrrole bath varies as a function of time (minutes) for glass slides with different surface treatments, hydrophilic/untreated (dark squares), hydrophobic glass (dark diamonds), and SPS treated (open squares).

Variation in the Amount of Polypyrrole Deposited onto a Surface During a Single Dip in a Bath as a Function of Time for Substrates with Different Surface Treatments FIG. 5 shows how the amount of polypyrrole deposited onto a surface during a single dip in a polypyrrole bath varies as a function of time for glass slides with different surface treatments. In this case, the optical absorption of polypyrrole at 550 nm was used to monitor the amount of conductive polymer deposited onto the surface. Hydrophobic surfaces were created by a vapor phase treatment with hexamethyl disilazane. Negatively charged surfaces were created by treatment with N-2-aminoethyl-3-aminopropyl-trimethoxysilane, which binds groups with positive charges to the surface, followed by the deposition of a single layer of sulfonated polystyrene (SPS) by immersion in a 0.01M, pH 2.5 SPS solution for 20 minutes. This latter treatment produces a surface with excess negative charges from the SPS polyanion. The polypyrrole dipping solution contained 0.02 m/l pyrrole, 0.006 m/l $FeCl_3$ and 0.026 m/l p-toluene sulfonic acid (solution pH=1.0).

As demonstrated by the figure, the amount of polypyrrole deposited onto a surface is greatly enhanced if the surface has excess negative charges available for ionic bonding. For the dipping times found to be ideal for molecular-level deposition of polypyrrole (5 minutes) onto a negatively charged surface, essentially no polypyrrole is deposited onto hydrophobic and hydrophilic surfaces. Even after 10 minute dipping times, the amount of polypyrrole deposited onto glass is significantly larger for a negatively charged surface than for a hydrophilic or hydrophobic surface. This shows that in situ polymerized polypyrrole is quickly adsorbed onto a negatively charged surface. Thus, the controlled deposition of ultra-thin films of polypyrrole is most readily accomplished on surfaces previously coated with a polyanion.

EXAMPLE 8

Selective Deposition of Monolayers of Polypyrrole onto Regions of a Surface that are Negatively Charged To further check the selectivity of the polypyrrole deposition process, a glass slide half coated with a monolayer of a polyanion and half coated with a monolayer of a polycation was dipped for 5 minutes into a solution containing 0.02 m/l pyrrole, 0.006 m/l FeCl$_3$ and 0.026 m/l p-toluene sulfonic acid (pH=1.0). The slide was prepared by first coating the entire slide with a monolayer of sulfonated polystyrene by dipping in a 0.01M, pH 2.5 SPS solution for 20 minutes, followed by dipping only half of the slide into an aqueous solution of 0.001 m/l poly(allylamine hydrochloride) for 20 minutes. This latter polymer is a polycation and therefore places excess positive charges on the surface that its solution contacts. After dipping the half polyanion/half polycation slide completely into the polypyrrole bath, it was found that a uniform, conducting monolayer of polypyrrole was only deposited onto the region of the slide that had excess negative charges due to the presence of a surface monolayer of SPS. No deposition at all was observed on the region of the slide that had a surface monolayer of the polycation. This shows that it is possible to selectively deposit monolayers of polypyrrole onto regions of a surface that are negatively charged and selectively block the deposition of polypyrrole onto regions of a surface that are positively charged. This means that it is possible to create selectively patterned regions of a surface that are coated with a monolayer of conducting polypyrrole.

EXAMPLE 9

Layer-by-Layer Deposition via an in situ Polymerization Approach using Polyaniline Solutions suitable for depositing controlled molecular layers of electrically conductive polyaniline via an in situ polymerization process were prepared by adding aniline monomer and p-toluene sulfonic acid to an aqueous ammonium peroxysulfate solution. The dipping solution was aged for 15 minutes and filtered prior to use. Layer-by-layer deposition was achieved by using a solution with an aniline concentration of 0.027 m/l, an ammonium peroxysulfate concentration of 0.0021 m/l and a p-toluene sulfonic acid concentration of 0.026 m/l. Sulfonated polystyrene solutions of 0.001 m/l and pH=1.0 were used as the polyanion dipping solutions.

Multilayer films were fabricated by first dipping the substrate into the in situ polymerized polyaniline solution for 5 minutes followed by dipping in the sulfonated polystyrene solution for 10 minutes. Between dips, the substrates were vigorously washed with water and dried under a stream of compressed air. Visible spectra recorded during the process of fabricating a multilayer thin film onto a glass substrate previously treated to place negative charges on its surface revealed that each dip in the polyaniline solution delivered a uniform and reproducible amount of doped polyaniline. This shows that layer-by-layer deposition via an in situ polymerization approach is also possible with polyaniline.

EXAMPLE 10

Fabrication of Multilayer Films by Alternately Dipping a Substrate into a Doped Polyaniline Solution and a Polyanion Solution This example shows that the layer-by-layer molecular self-assembly of p-type doped conducting polymers can also be achieved by using dipping solutions containing preformed conducting polymers. Solutions containing doped polyaniline, synthesized using the procedures reported by J-C. Chaing and A. G. MacDiarmid, *Syn. Metals*, 13 (1986) 193, were prepared by first dissolving 0.47 g of the emeraldine-base form of this polymer in 25 mL of DMAc (dimethylacetamide) with vigorous stirring and subsequent ultrasonic treatments to insure complete dissolution. After all of the polymer was dissolved, 3 mL of this solution was slowly added with stirring to 26 mL of pH 3.5 acidic water (acidified with methane sulfonic acid (MeSO$_3$H) or hydrochloric acid). The pH of the final polyaniline dipping solution was then adjusted to a level of 2.5 using 1 mL of pH 1 and 0.33 mL of pH 0 acidic solutions respectively. In order to make dipping solutions with different polymer concentrations and pH levels, the concentration of the polyaniline/DMAc stock solution and the pH of the MeSO$_3$H or HCl solutions were adjusted accordingly. Polyanion solutions of sulfonated polystyrene (SPS) were made by stirring the SPS in MeSO$_3$H or HCl aqueous solutions. In all cases, a 0.01M, pH 2.5 SPS solution was used for dipping. All solutions were filtered with 2–4 µm filter paper before use.

Multilayer films were made by alternately dipping a substrate into a doped polyaniline solution and a polyanion solution. The substrates were dipped in each solution for 5–10 minutes and subsequently washed and rinsed with pH 2–4 solutions for 15 seconds respectively. The pH of the washing and rinsing solutions was adjusted to be the same as the pH of the dipping solutions. After each deposition and cleaning step, the samples were blown dry with a gentle flow of compressed filtered air.

Figure 6:
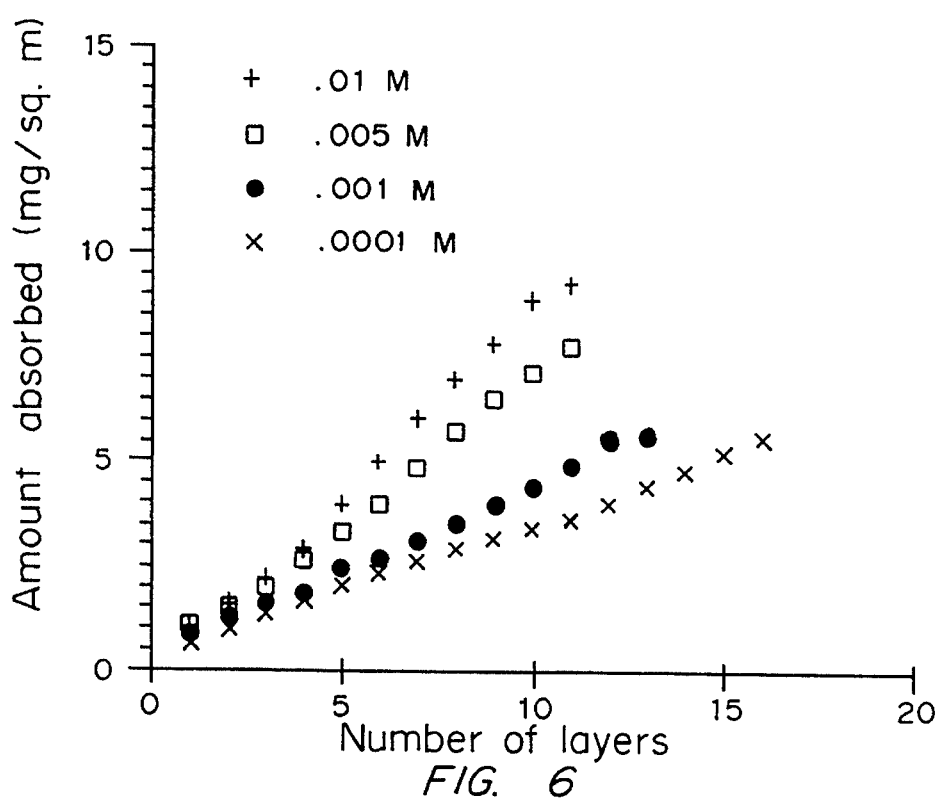
FIG. 6 is a graph of the amount of polyaniline adsorbed onto the surface of a glass slide (estimated from optical absorption data) as a function of the number of layers deposited from solutions with different polyaniline concentrations: 0.01M (+), 0.005M (squares), 0.001M (dark circles), and 0.0001M (X), where the polyanion was sulfonated polystyrene.

FIG. 6 shows a plot of the amount of polyaniline adsorbed onto the surface of a glass slide (estimated from optical absorption data) as a function of the number of layers deposited from solutions with different polyaniline concentrations, where the polyanion was sulfonated polystyrene. The linear behavior of these various plots clearly indicates that, regardless of the polyaniline concentration, the assembled layers of polyaniline each contribute, on average, an equal amount of material to a given film. This is the characteristic signature of a well behaved layer-by-layer deposition process. These data also show that the amount of polyaniline deposited per layer is strongly dependent upon solution concentration. Profilometry and ellipsometry measurements show that the thickness contributed by each polyaniline/sulfonated polystyrene bilayer varies from 36 Å (0.01M solutions) to 12.5 Å (0.0001M solutions) when dipping times of 5 minutes are used for each layer, as demonstrated in Table 2. This again demonstrates that it is possible to control the deposition process by simple adjustments in the solution chemistry.

After exposing these films to pH=0 HCl or methane sulfonic acid solutions, electrical conductivities of about 1 S/cm are obtained after as few as 4 layers of polyaniline (PANi) have been deposited.

TABLE 2

Thickness contributed per bilayer in polyaniline/SPS films fabricated with a dipping time of 5 minutes.

| Solution concentration (M) | Thickness per PANi/SPS bilayer (Å) |
| --- | --- |
| 0.01 | 36 |
| 0.005 | 28 |
| 0.001 | 20 |
| 0.0001 | 12.5 |

EXAMPLE 11

Figure 7:
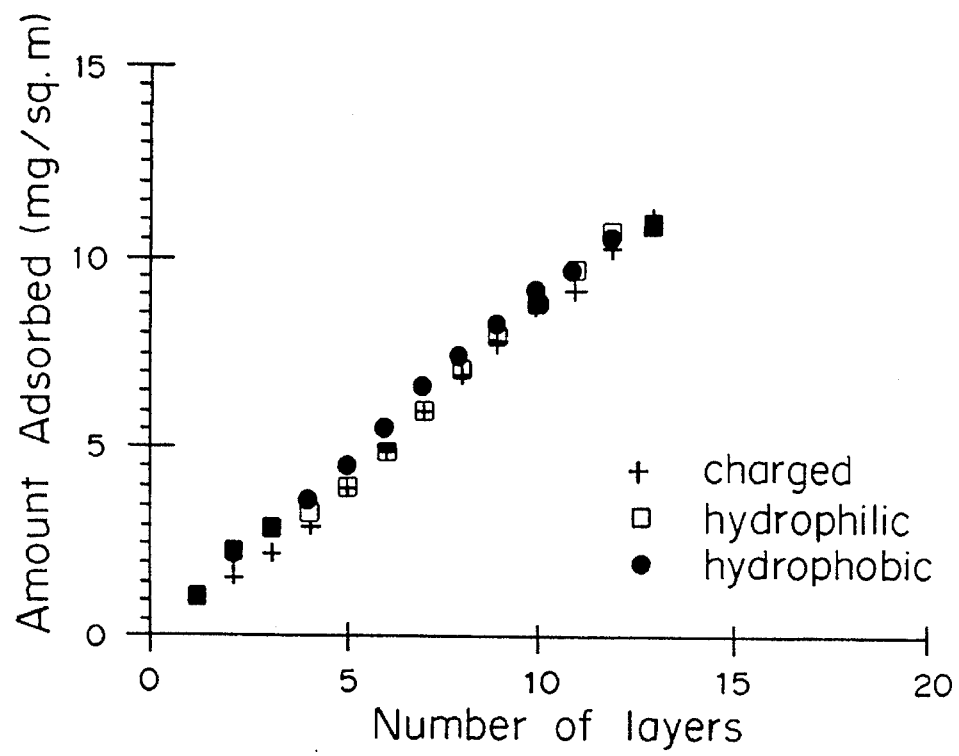
FIG. 7 is a graph showing the amount of polyaniline deposited from 0.01M, pH 2.5 solutions onto negatively charged (+), hydrophilic (open squares) and hydrophobic (dark circles) glass substrates as a function of the number of alternating layers of polyaniline/sulfonated polystyrene deposited.

Deposition of Polyaniline and a Suitable Polyanion onto Substrates with Different Surface Characteristics FIG. 7 shows the amount of polyaniline deposited from 0.01M, pH 2.5 solutions onto negatively charged, hydrophilic and hydrophobic glass substrates as a function of the number of alternating layers of polyaniline/sulfonated polystyrene deposited as described in Example 9. This figure shows that the well defined layer-by-layer deposition of polyaniline and a suitable polyanion can be accomplished with substrates with different surface characteristics. Thus, it is not necessary to pretreat the substrate surface for multilayer fabrication.

EXAMPLE 12

Effect of Polyaniline Layer Thickness on Solution pH

Figure 8:
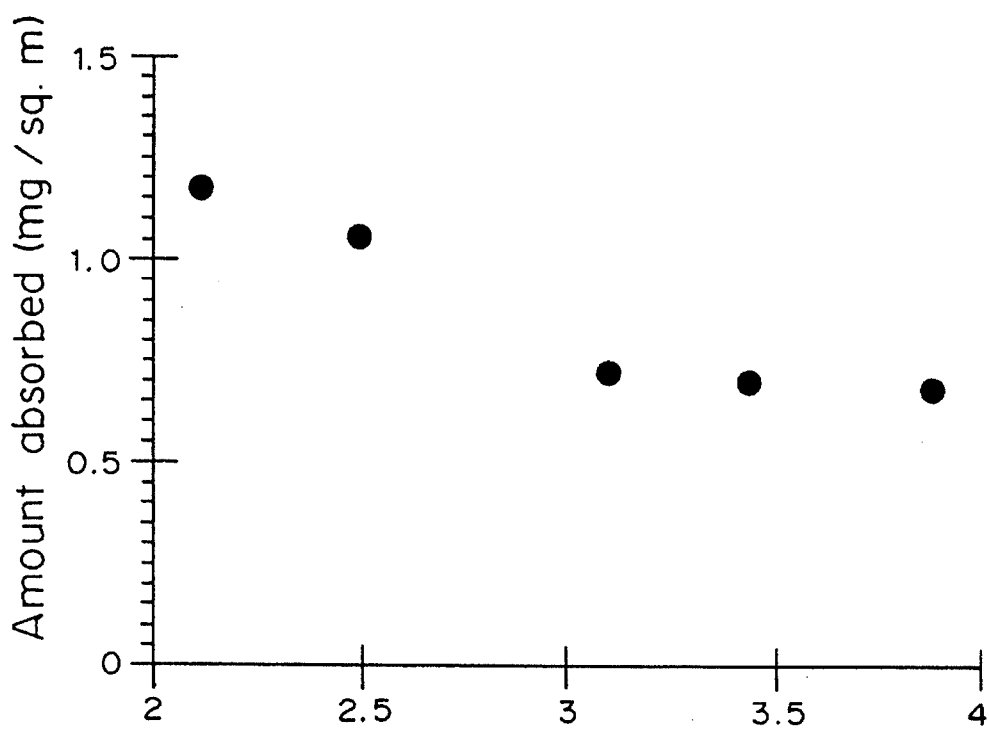
FIG. 8 is a graph of the dependence of the amount of polyaniline deposited per layer (mg/m$^2$) on dipping solution pH.

The dependence of the amount of polyaniline deposited per layer on dipping solution pH is illustrated in FIG. 8. As indicated in the figure, the amount of polyaniline adsorbed per layer increases as pH decreases. At low pH levels, the charge density along the PANi backbone is high; therefore, more material is adsorbed onto the polyanion layer. At high pH levels, the number of charges along the backbone is smaller and less material is adsorbed onto the polyanion layer.

EXAMPLE 13

Effect of Charge on the Substrate on Polyaniline Multilayer Fabrication

In order to verify that the multilayer fabrication process involving the deposition of alternating layers of p-type doped polyaniline and a polyanion is related to the charges created along the polyaniline backbone by acid doping, two experiments were performed.

The first study involved the use of a non-charged form of polyaniline (PANi) which was made by simply adjusting a PANi dipping solution to a level of pH 7. In contrast to the previously described solutions containing doped polyaniline having a pH of between 2 and 4 which are stable for months, such a solution is stable only for a few hours; the experiment was therefore run within this time period.

It was found that the construction of multilayer films was simply not possible. A single monolayer of polyaniline was initially adsorbed on various glass substrates, but subsequent multilayer fabrication via alternation with a polyanion was not achieved since there were no positive charges along the polyaniline backbone to attract the polyanion.

A second experiment was conducted to check if the PANi adsorption process would occur on a positively charged surface. In this case, a substrate was immersed in a doped PANi dipping solution followed by immersion in a conventional polycation solution such as a polyallylamine hydrochloride solution.

Again it was found that multilayer fabrication was not successful. In this case, only the adsorption of one PANi layer was observed. It has also been found that doped polyaniline will not adsorb onto a surface that is already positively charged. These experiments prove that the multilayer deposition process requires the alternate deposition of an acid doped form of polyaniline and a polyanion.

EXAMPLE 14

Electrical Conductivity of Polyaniline/Sulfonated Polystyrene Multilayer Films as a Function of the Number of Deposited PANi Layers Deposited on Charged, Hydrophilic and Hydrophobic Substrates The electrical conductivity of polyaniline/sulfonated polystyrene multilayer films doped with 1M HCl was measured as a function of the number of deposited PANi layers from multilayer films deposited on charged, hydrophilic and hydrophobic substrates.

Figure 9:
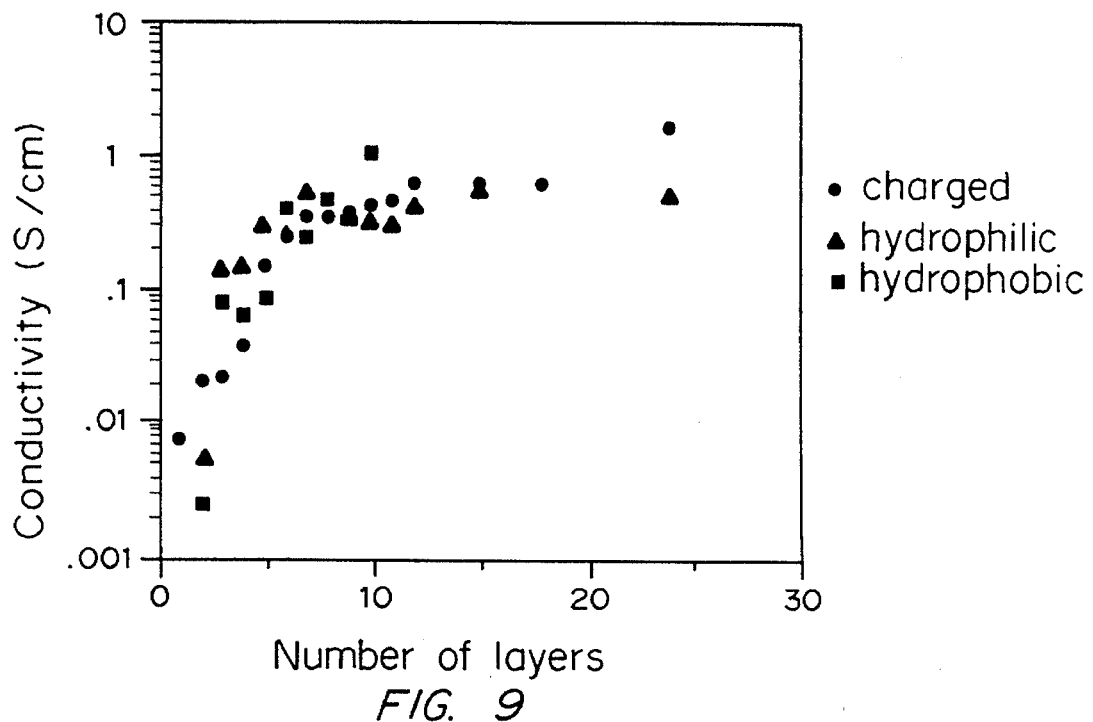
FIG. 9 is a graph of conductivity (S/cm) versus number of layers for surfaces which are charged (dark circles), hydrophilic (dark triangles), and hydrophobic (dark squares). This graph shows that a conductivity in the range of 0.5–1 S/cm is reached with as few as 4 PANi/SPS layers.

FIG. 9 shows that a conductivity in the range of 0.5–1 S/cm is reached with as few as 4 PANi/SPS layers. It also shows that the deposition of a single layer of polyaniline is not sufficient to render a surface highly conductive, that is, multilayers are required to create the highest level of conductivity.

EXAMPLE 15

Fabrication of Highly Transparent, Electrically Conductive Coatings on Plastics Substrates via the Self-assembly of p-type Doped Polyaniline and a Polyanion This example shows that highly transparent, electrically conductive coatings on various plastics, including molded parts with complex shapes, can be created via the self-assembly of p-type doped polyaniline and a polyanion. Such coatings are ideally suited for applications requiring transparent anti-static coatings.

Using the deposition process described in Example 9 and a polyaniline dipping solution containing 0.001 m/l polyaniline (pH 2.5, adjusted with methane sulfonic acid), three bilayers of polyaniline/sulfonated polystyrene were deposited onto polystyrene culture dishes and poly(ethylene terephthalate) plastic sheets. The substrates to be coated were first dipped into the sulfonated polystyrene bath (0.001 m/l, pH 2.5 (adjusted with methane sulfonic acid)) followed by dipping into the polyaniline bath (10 minute dips). Between dips, the substrates were rinsed with pH 3.5 methane sulfonic acid solutions.

In all cases, the plastic dishes and sheets were coated with a uniform, ultrathin, essentially transparent, light green coating comprised of three alternating bilayers of polyaniline/sulfonated polystyrene. The surface resistance of these various coated plastic substrates was in the range of 2–5M ohms after additional doping by immersion in a pH 0 methane sulfonic acid solution and remained essentially the same one month after the initial measurements were made.

Thus, with as few as three bilayers, it is possible to create uniform, transparent coatings with low resistivities. The adhesion of these coatings to the plastic substrates was found to be excellent.

EXAMPLE 16

Deposition of Electrically Conductive Coatings of Polyaniline onto a Wide Variety of Different Substrates via a Layer-by-layer Deposition Process This example shows that electrically conductive coatings of polyaniline can be deposited onto a wide variety of different substrates via a layer-by-layer deposition process.

Using the deposition procedure described in Example 9 and a polyaniline dipping solution containing 0.01 m/l polyaniline (pH 2.5, adjusted with methane sulfonic acid), five to ten alternating bilayers of polyaniline/sulfonated polystyrene and polyaniline/sulfonated polyaniline were successfully deposited onto the following substrates: platinum coated glass slides, gold coated glass slides, silver coated glass slides, aluminum coated glass slides, indium tin oxide coated glass, mica, graphite, tygon tubing (both inside and outside surfaces) and plexiglass. In all cases, uniform thin coatings were obtained.

EXAMPLE 17

Stability of the Electrical Resistance of 10 Bilayer Thin Films of Polyaniline/Sulfonated Polystyrene that were Self-Assembled onto Glass Substrates The electrical resistance of 10 bilayer thin films of polyaniline/sulfonated polystyrene that were self-assembled onto glass substrates using the procedure outlined in Example 9 was tested for stability at elevated temperatures. In this case, samples were further doped after fabrication with either pH 0 HCL or methane sulfonic acid (MSA) solutions. The results are shown in Table 3 below.

TABLE 3

Stability of Electrical Resistance of Polyaniline/sulfonated polystyrene thin films at various times and temperatures.

| Temp./ Exposure Time | MSA Doped Sample | HCl Doped Sample |
| --- | --- | --- |
| 25° C. | 2.6 M ohms | 4.8 M ohms |
| 40° C./1 hr | 1.8 M ohms | 15 M ohms |
| 40° C./3 hr | 1.3 M ohms | 11 M ohms |
| 90° C./1 hr | 1.0 M ohms | 87 M ohms |
| 90° C./3 hr | 1.5 M ohms | 180 M ohms |

These results show that HCl doped samples are not very stable and quickly lose their conductive nature at elevated temperatures. MSA doped samples, on the other hand, are very stable. In fact, treatment at 40° C. for 3 hours or 90° C. for 3 hour actually slightly increases their conductivity.

EXAMPLE 18

Multilayer Fabrication with a Preformed p-type Doped Conducting Polymer Dissolved in a Nonaqueous Solution This example shows that multilayer fabrication can be accomplished with a preformed p-type doped conducting polymer dissolved in a nonaqueous solution. In this case, a conducting polymer dipping solution was made by adding 1.0 ml of a 0.017 m/l solution of $FeCl_3$ in nitromethane to a $5 \times 10^{-4}$ m/l poly(3-hexylthiophene) in chloroform solution. This produces a deep blue nitromethane/chloroform dipping solution which contains dissolved chains of p-type doped poly(3-hexylthiophene). Multilayers were successfully fabricated by first dipping a glass substrate, previously treated to carry a negatively charged surface, into the poly(3-hexylthiophene) solution for 5 minutes and then into an aqueous polyanion solution containing 0.001 m/l of sulfonated polystyrene at pH=1.0 for 5 minutes. After the polyanion dip, the substrate was rinsed with water, dried and immersed in a 0.017 m/l $FeCl_3$/nitromethane solution for 10 minutes to redope the conducting polymer which dedopes in the aqueous polyanion bath. This process was repeated to create multilayer thin films in which each bilayer contains an equal amount of deposited poly(3-hexylthiophene).

EXAMPLE 19

Fabrication of Heterostructure Thin Films

To demonstrate that it is possible to fabricate multilayer thin films with controllable layer sequences, heterostructure thin films were fabricated using the procedures described in the above examples. These complex multilayer films were fabricated by simply dipping a substrate into a solution containing the specific polymer to be deposited followed by the deposition of a polymer of the opposite charge. As long as positively and negatively charged polymers are alternately deposited onto the substrate surface, heterostructures of any type and form can be easily fabricated.

The following layer sequences were deposited to demonstrate this process. The successful deposition of each conjugated polymer layer was confirmed by visible spectroscopy.
1) 5 bilayers of poly(thiophene acetic acid)/poly(allylamine) alternating with 5 bilayers of polypyrrole/sulfonated polystyrene to a total of 30 layers.
2) 5 bilayers of sulfonated polystyrene/poly(allylamine) alternating with 5 bilayers of polyaniline/sulfonated polystyrene to a total of 30 layers.
3) 2 bilayers of polyaniline/sulfonated polystyrene alternating with 2 bilayers polypyrrole/sulfonated polystyrene to a total of 10 layers.
4) alternating bilayers of polyaniline/sulfonated polystyrene—polypyrrole/sulfonated polystyrene—poly(thiophene acetic acid)/poly(allylamine) and sulfonated polyaniline/poly(allylamine) to a total of 30 layers.

In summary, the ability to readily fabricate multilayer thin films of p-type doped conjugated polymers via a molecular self-assembly process opens up completely new vistas with regard to the thin film processing of conducting polymers and related electroactive materials. Through the alternate deposition of doped conjugated polymers and conjugated/nonconjugated polyanions it is now possible to fabricate an unprecedented number of complex thin film architectures with complete control over the supramolecular organizations of the resultant heterostructures. Such films can be used to fabricate and examine new thin film devices and sensors and to tailor the electrical and optical properties of various surfaces at the molecular level.

EXAMPLE 20

Fabrication of Multilayer Films by Alternately Dipping a Substrate into a Doped Polyaniline Solution Containing a Water Soluble, Non-ionic Polymer This example shows that the layer-by-layer deposition of preformed p-type doped conducting polymers such as polyaniline can also be achieved by using dipping solutions that contain non-ionic, water soluble polymers. It is believed that layer-by-layer self-assembly occurs in this case due to the formation of hydrogen bonds between polyaniline and the water soluble polymer. Thus, it is possible to use nonbonded interactions other than ionic bonds to fabricate multilayer films as long as these secondary forces are strong enough to promote self-assembly.

The polyaniline used in this example was the same as that described in example 10. The polyaniline was dissolved in either NMP or DMAc by stirring 18 mg/ml overnight, then sonicating the solution for about 8–10 hours. The resulting solution had some fine particulates that were filtered out with a 2 µm filter, followed by a 0.45 µm filter. The polyaniline dipping solution was prepared by mixing 10 vol % of the polyaniline solution was prepared by mixing 10 vol % of the polyaniline solution in DMAc (or NMP) with 90 vol % water with the pH adjusted to 2.5 with methane sulfonic acid (MeSA). The polyaniline concentration can be varied, as can the pH; 0.01M (molar in terms of two aniline repeat units) was used in this study. The solution was then filtered through a 0.45 µm filter.

Three distinctly different non-ionic water soluble polymers were used to fabricate multilayer thin films: poly(vinyl pyrrolidone), poly(vinyl alcohol) and poly(ethylene oxide). Thus, non-ionic water soluble polymers containing a wide variety of functional groups such as pyrrolidone, alcohol or ether groups can be used to successfully fabricate multilayer thin films with p-type doped polyaniline. Each of these groups is capable of forming hydrogen bonds with polyaniline.

Poly(vinyl pyrrolidone) (PVP, MW=1,000,000 g/mole) was used as-received from Polysciences, and was dissolved in water at 1.11 mg/ml, corresponding to 0.01M solution in terms of one vinyl pyrrolidone repeat unit, then filtered through a 0.2 µm filter. The pH can be adjusted, but the solution delivers the thickest films with no pH adjustment. This solution has a pH of about 4.5.

Poly(vinyl alcohol) (PVA, MW=86,000) was used as-received from Scientific Polymer Products, and was dissolved in water at 0.44 mg/ml, also corresponding to 0.01M solution in terms of one vinyl alcohol repeat unit, then filtered through 0.2 µm filter. The resulting solution has a pH of 6.25.

Poly(ethylene oxide) (PEO, MW=5,000,000) was used as-received from Aldrich, and was dissolved in water at 0.44 mg/ml, also corresponding to 0.01M solution in terms of one ethylene oxide repeat unit, then filtered through 0.2 µm filter. The solution has a pH of 6.3.

In the following examples, polyaniline was first deposited onto glass slides with a net negative charge by dipping the slides in the above indicated polyaniline solutions for 15 minutes. Negatively charged slides were created by absorbing a single layer of polystyrene sulfonic acid onto slides that had been previously chemically treated with silane to produce a positively charged surface. As indicated in Example 10, doped polyaniline adsorbs quite readily to a negative surface. The substrates were then immersed in the non-ionic polymer solution for 15 minutes, followed by rinsing with neutral water. From there, layers were built up by simply alternating between the polyaniline solution and either the PVP, PVA, or PEO solution. Final complete doping was achieved by subsequent immersion in a methane sulfonic acid solution at pH=0.4, followed by a quick rinse in pH=0.3 HCl solution.

Layer-by-layer build-up was monitored by visible spectroscopy. Visible light absorption spectra were taken directly from coated glass slides using an Oriel 250 mm spectrophotometer. The spectra were recorded after every bilayer on films that were dedoped by immersion in pH=7.0 water solutions.

Figure 10:
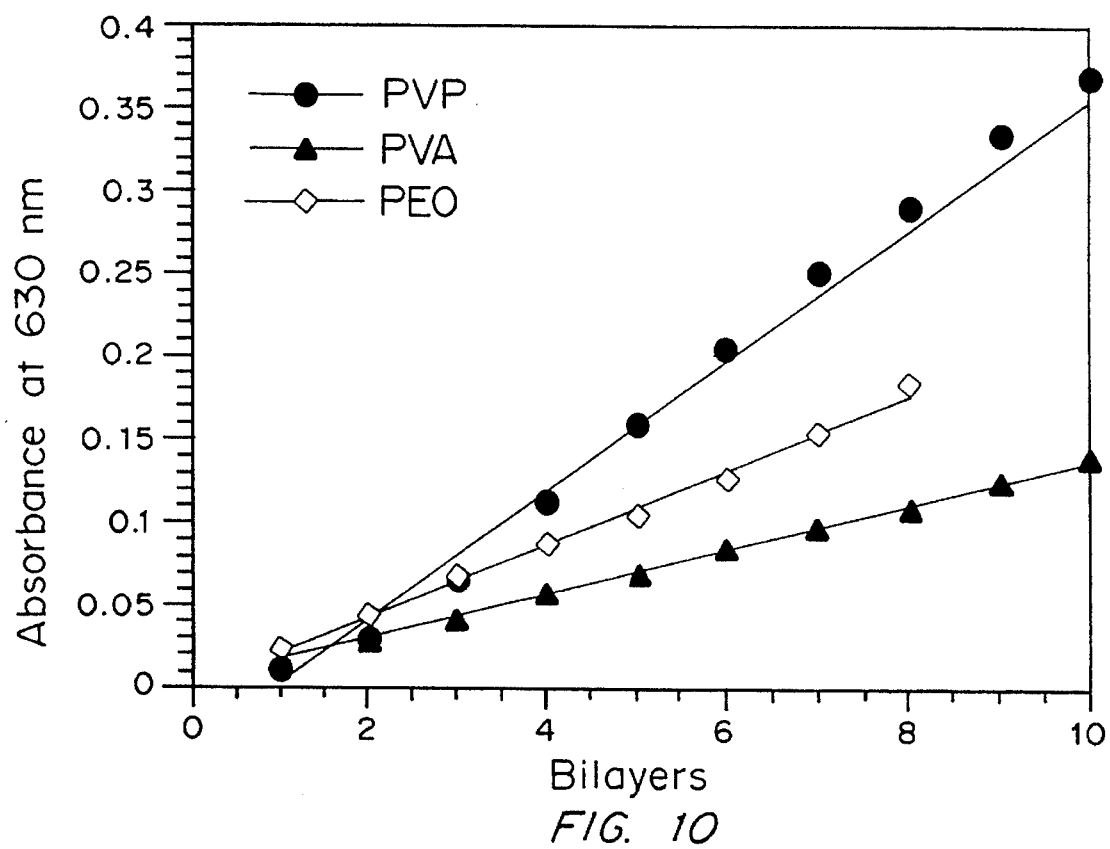
FIG. 10 is a graph of the absorption at 630 nm as a function of the number of bilayers deposited for films fabricated with p-type doped polyaniline and poly(vinyl pyrrolidone) (PVP) (closed circle), poly(ethylene oxide) (PEO) (open diamonds), and poly(vinyl alcohol) (PVA) (closed triangles).

FIG. 10 shows this build-up for polyaniline films fabricated with PVP, PVA and PEO solutions as determined by plotting the visible light absorption maximum (630 nm for polyaniline in its base form) versus the number of deposited bilayers. In all cases it can be clearly seen that the layer-by-layer deposition process is completely reproducible from layer to layer, indicating that each dip is delivering essentially the same amount of material to the substrate. Linear deposition of this type has been observed up to at least 15 deposited bilayers.

The film thicknesses were measured by both profilometry (using a Sloan Dektak 8000) and by ellipsometry (for films on reflective surfaces, using a Gaertner three wavelength ellipsometer). Conductivities of fully doped films were measured by the standard four point van der Pauw method in air. Table 4 outlines the sample thicknesses and conductivities for several example films, as well as the approximate vol % of polyaniline in each film.

TABLE 4

Sample thicknesses and conductivities for several example films.

| Polymer System | Overall Thickness (Å) | Thickness/ bilayer (Å) | Conductivity (S/cm) | vol % PAn |
|---|---|---|---|---|
| PAn/PVP | 1205 (15 bilayers) | 80 | 2.32 | 58% |
| PAn/PEO | 525 (8 bilayers) | 66 | 0.38 | 45% |
| PAn/PVA | 500 (15 bilayers) | 33 | 1.08 | 53% |

From Table 4, it can be seen that all three of these bilayer systems produced highly conductive multilayer thin films with bilayer thicknesses in the range of 30–80 Å. Thus, using these various non-ionic water soluble polymers it is possible to create highly uniform multilayer thin films with thicknesses that can be controlled at the molecular level and with conductivities as high as 2 S/cm. In fact, it has been found that these multilayer films reach their maximum conductivity values when only three bilayers have been deposited on a substrate surface and surfaces coated with only two bilayers already display conductivities within one order of magnitude of the maximum value.

Multilayer films based on non-ionic water soluble polymers can be deposited onto a variety of substrates, including glass, many plastics, silicon wafers, and metals. Bilayer thicknesses can also be controlled from 10 to over 250 Å, more preferably 10 to 100 Å, per bilayer by changes in solution concentrations, pH, and dip times.

Modifications and variations of the method and devices of the present invention will be obvious to those skilled in the art from the foregoing detailed description. Such modifications and variations are intended to come within the scope of the following claims.

We claim:

1. A thin film heterostructure on a substrate, the thin film heterostructure comprising a p-doped conjugated polymer monolayer on the substrate, and a monolayer of polymer selected from the group consisting of polyanions and water soluble, non-ionic polymers, bound to the p-doped conjugated polymer monolayer, wherein a bilayer is formed of the polyanion or water soluble, non-ionic polymer and p-doped conjugated polymer monolayers which is between approximately 10 and 250 Å in thickness, and wherein the monolayers are adsorbed onto the substrate and are bound by non-covalent attractions.

2. The heterostructure of claim 1 wherein the polyanions are conjugated or nonconjugated polymers.

3. The heterostructure of claim 1 wherein the water soluble non-ionic polymer is selected from the group consisting of poly(vinyl pyrrolidone), poly(vinyl alcohol), poly(ethylene oxide), and poly(acrylamide).

4. The heterostructure of claim 1 further comprising multiple polyion bilayers of the same or different polymers.

5. The heterostructure of claim 1 wherein the substrate is selected from the group consisting of fibers, plates, films.

6. The heterostructure of claim 1 wherein the polymer is a polyanion selected from the group consisting of sulfonated polystyrene, sulfonated polyaniline, and poly(thiophene-3-acetic acid).

7. The heterostructure of claim 2 wherein the doped conjugated polymer is selected from the group consisting of p-doped polyaniline, polypyrrole, and poly(3-hexyl thiophene).

8. The heterostructure of claim 1 having a conductivity of greater than $10^{-6}$ S/cm for a period of greater than one day in air.

9. The heterostructure of claim 2 wherein the p-doped conjugated polymer monolayer is prepared by dipping substrate in an aqueous solution of a p-doped conjugated polymer.

10. The heterostructure of claim 2 wherein the thin film heterostructure further comprises a polyanion coating between the substrate and the p-doped conjugated polymer.

* * * * *